(12) United States Patent
Ebner

(10) Patent No.: US 8,742,312 B2
(45) Date of Patent: Jun. 3, 2014

(54) OPTICAL DETECTOR SUITABLE FOR USE IN LIGHT CURTAINS

(75) Inventor: Richard Ebner, Wels (AT)

(73) Assignee: Isiqiri Interface Technologies GmbH (AT)

( * ) Notice: Subject to any disclaimer, the term of this patent is extended or adjusted under 35 U.S.C. 154(b) by 170 days.

(21) Appl. No.: 13/264,703

(22) PCT Filed: Apr. 15, 2010

(86) PCT No.: PCT/AT2010/000108
§ 371 (c)(1),
(2), (4) Date: Oct. 14, 2011

(87) PCT Pub. No.: WO2010/118449
PCT Pub. Date: Oct. 21, 2010

(65) Prior Publication Data
US 2012/0038924 A1  Feb. 16, 2012

(30) Foreign Application Priority Data

Apr. 16, 2009 (AT) .................................. A 586/2009
Jun. 30, 2009 (AT) ................................ A 1015/2009

(51) Int. Cl.
*G01J 1/42* (2006.01)
*G01N 21/00* (2006.01)
*G01B 11/14* (2006.01)

(52) U.S. Cl.
USPC ........................ 250/208.2; 356/435; 356/622

(58) Field of Classification Search
USPC ........ 250/208.1, 214 R, 221, 208.2; 345/158, 345/175, 176; 356/432–435, 622
See application file for complete search history.

(56) References Cited

U.S. PATENT DOCUMENTS

| 5,132,530 A | 7/1992 | Groh et al. |
| 5,635,724 A | 6/1997 | Higgins |
| 5,759,291 A * | 6/1998 | Ichinose et al. ............... 136/256 |
| 2002/0180344 A1 * | 12/2002 | Lichtfuss ..................... 313/498 |

(Continued)

FOREIGN PATENT DOCUMENTS

| DE | 3441498 A1 | 5/1986 |
| DE | 3441498 C2 | 3/1989 |

(Continued)

OTHER PUBLICATIONS

International Search Report for PCT/AT2010/000108, English translation attached to original, Both Completed by the European Patent Office on Oct. 19, 2010, All together 7 Pages.

(Continued)

*Primary Examiner* — Thanh Luu
*Assistant Examiner* — Renee Naphas
(74) *Attorney, Agent, or Firm* — Brooks Kushman P.C.

(57) ABSTRACT

A planar detector for use in light curtains, which generates electric signals as a function of absorbed light and is provided with a plurality of tapping points for the generated signals. The magnitude of the signals at the respective tapping points is dependent on their distance to the partial surfaces where the light is absorbed. As a function of the magnitude ratios between the signals at several tapping points, the distance ratios of the respective tapping points to those partial surfaces, where the light is absorbed, can be calculated. The detector is configured as a flexible layered structure made of organic material. The tapping points are disposed at a distance from the edges of the layered structure. Electric connection lines to the tapping points are connected along their longitudinal extension to the layered structure of the detector.

12 Claims, 6 Drawing Sheets

(56) References Cited

U.S. PATENT DOCUMENTS

Figure 1:
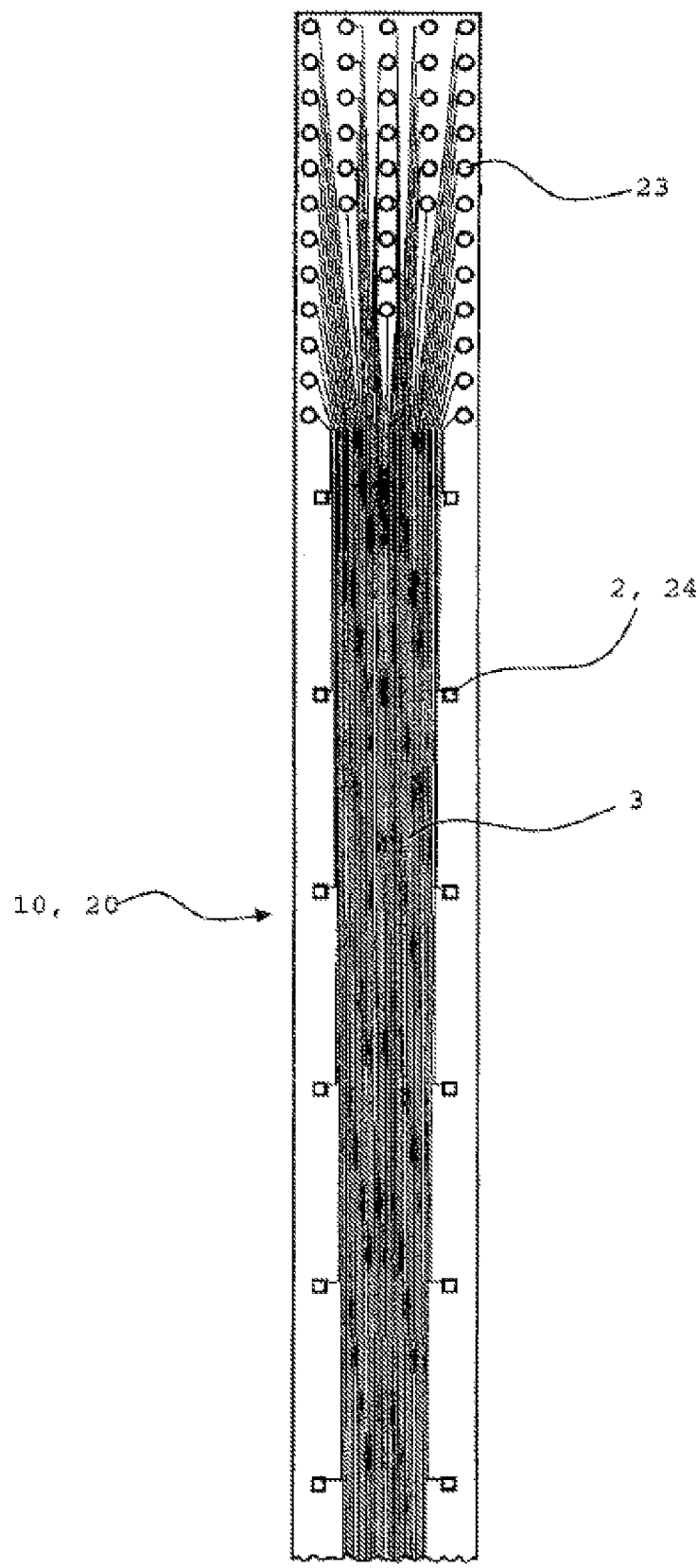

2006/0279558 A1* 12/2006 Van Delden et al. ......... 345/176
2007/0176165 A1   8/2007 Forrest et al.
2007/0211239 A1   9/2007 Mandella et al.
2011/0266423 A1  11/2011 Koeppe et al.

FOREIGN PATENT DOCUMENTS

| | | | |
|---|---|---|---|
| DE | 102005040351 B4 | 5/2007 | |
| EP | 0361374 A2 | 4/1990 | |
| WO | 2010078609 A1 | 7/2010 | |

OTHER PUBLICATIONS

Koeppe et al. "Video-speed detection of the absolute position of a light point on a large-area photodetector based on luminescent waveguides", Optics Express Feb. 1, 2010, vol. 18, No. 3, p. 2209-2218.

* cited by examiner

OPTICAL DETECTOR SUITABLE FOR USE IN LIGHT CURTAINS

CROSS-REFERENCE TO RELATED APPLICATION

This application is the U.S. national phase of PCT Appln. No. PCT/AT2010/000108 filed Apr. 15, 2010 which claims priority to Austrian application A 586/2009 filed Apr. 16, 2009 and Austrian application A 1015/2009 filed Jun. 30, 2009, the disclosures of which are incorporated in their entirety by reference herein.

Light curtains are usually formed by stringing together light barriers oriented parallel to one another. Occasionally, use is made of light sources in which the cross-sectional area of the emitted light beam has approximately the form of a straight line. By arranging this line parallel to the orientation of the row formed by stringing together light sensors, a smaller number of light sources compared with light sensors can suffice.

US 2007/176165 A1 discloses a design for a position detector based on light-sensitive organic semiconductors for an impinging light spot. The detector, having a planar construction, consists of a plurality of layers. A first, planar electrode, having a high non-reactive resistance, extends on a substrate composed of glass or a flexible organic material. Said electrode is followed by a layer composed of organic photoactive materials, within which a donor layer and an acceptor layer are adjacent to one another. This is in turn followed by a planar electrode, which, however, has a low non-reactive resistance. At the edge thereof, the photoactive materials are provided with two to 8 point- or line-like connection electrodes spaced apart from one another. If a concentrated light beam with an appropriate wave spectrum impinges on a point of the layer composed of photoactive materials, then a current flows through the individual connection electrodes. From the magnitude of the current in the individual connection electrodes, it is possible to deduce the proximity thereof to the impingement point of the light beam and thus to calculate the impingement point of the light beam through a kind of triangulation.

EP 0 361 374 A2 proposes forming a light detector by virtue of the fact that fluorescent radiation that arises in a light-transmissive plastic doped with an organic fluorescent dye in the event of external light incidence is guided further to a light-sensitive semiconductor element by means of optical waveguides that are likewise doped with a fluorescent dye. It is thus possible to form large-area detector elements more cost-effectively than would be possible with light-sensitive semiconductor elements based on customary semiconductor materials such as typically silicon. However, the use of optical waveguides also leads to complicated work processes during production and assembly and to an increased space requirement.

In accordance with DE 34 41 498 C2, strips—doped with fluorescent substance—of a light-transmissive material such as glass or clear plastic are connected on one side to a photodiode and arranged alongside one another, such that they form a relatively large detector area within which it is possible to measure individually for partial areas whether or not they are struck by light. However, primarily the subdivision into individual areas that are separate with regard to guiding light leads to complicated manufacturing processes.

DE 10 2005 040 351 B4 describes a detector wherein a fluorescent material layer that is scarcely absorbent to not absorbent at all in the visible spectral range is applied on a planar light-guiding substrate such as typically a pane of glass, which layer converts incident UV light into light which is guided in the substrate also to the edge regions thereof. Radiation sensors optically coupled to the substrate are fitted to the edge regions of said substrate, which sensors convert the light power arriving from the substrate into an electrical signal. The detector can be fitted inconspicuously on glass areas present anyway, such as, for example, on glass partitions, glass doors, picture glazings, etc. In conjunction with an inconspicuously fitted UV light source which is arranged at a distance therefrom and emits light onto the detector, the detector can be used as a very inconspicuous access monitoring system for the space between light source and detector area. As soon as a person enters the region between detector and light source and shades at least part of the detector area, the arriving light power is reduced at least at individual radiation sensors from among those at edge sides and, accordingly, an altered electric signal is forwarded to a superordinate controller.

Proceeding from this prior art, the problem addressed by the invention is that of proposing a design for an optical detector for a light sensor which is intended to have advantages over the known designs with regard to the following features:

can be embodied well and cost-effectively as a long strip or as a relatively large area,
in the event of local light incidence capability of identifying at which partial area the light incidence takes place,
robust,
low assembly complexity, low assembly costs,
low production costs.

In order to solve the problem, it is proposed to design the detector as a flexible layered structured composed of an organic material, wherein light arriving in a layer brings about an optical or electrical signal that is conducted in a highly lossy manner along the layered structure. On one side of the layered structure, a plurality of mutually spaced-apart tapping points for the signals are fitted at a distance from the area edges. These would be photoelectric sensors for optical signals, and contact points on a conductive layer for electrical signals. Connection lines to the individual tapping points are fitted on one side of the layered structure and led to the tapping points.

In accordance with one advantageous embodiment, a layer of the detector is enriched with luminescent particles. Light scattered into said layer is converted by luminescence into light having a longer wavelength and is conducted by way of reflection at the interfaces of the layer within the layer to photodiodes of "classic" design. At said photodiodes, it brings about a measurable electrical signal. Since the intensity of the light arriving at a photodiode decreases with the spacing from the distance with respect to that point at which a light pulse passed into the layer from outside and triggered luminescence, the impingement point (or impingement region) of the externally impinging light can be calculated back from the comparison of the signal amplitudes of a plurality of mutually spaced-apart photodiodes.

In a further possible structure of the detector, a layer is formed by an organic photoactive material, wherein this layer is arranged between two planar electrodes electrically connected thereto, wherein at least one electrode has a relatively high non-reactive resistance within its electric circuit. If light is incident at a location of the photoactive layer, then the planar electrodes arranged on both sides of the photoactive layer are connected to one another at this location. The current through the more poorly conducting electrode is measured at a plurality of mutually spaced-apart connection points. The position of the location of the light incidence is calculated back from the relative magnitude of the different currents measured at the different connection points.

In accordance with one advantageous embodiment, the connection lines to individual tapping points of electrical signals are printed onto a layer of the layered structure. The method can be readily automated. The current intensities occurring in the system are so low that the rather small line cross sections that can be produced conveniently therewith suffice without any problems. Usually, the detectors according to the invention have a front and a rear side, wherein the front side is that side from which the light from the light source belonging to the light curtain is incident as intended. For optical reasons and in order that that layer of the detector which is relevant to the measurement is not covered unnecessarily, the connection lines are normally fitted behind that layer of the detector which is relevant to the measurement.

In a design which cannot be so readily automated but in return can be configured more flexibly, the connection lines are adhesively bonded onto the layered structure. For this purpose, the connection lines themselves can be part of a multipartite adhesive tape.

In a highly advantageous embodiment of a detector, the latter has the form of an elongate strip, wherein two rows of tapping points, said rows being situated at a distance from one another, extend along the longitudinal direction of this strip. Upon movement of an object through a light curtain that operates with a detector equipped in this way, the superordinate controller can thus identify from which side the object moves through the light curtain, since signal changes brought about by a change in the light conditions on account of the movement of the object take place more intensely and earlier at that side from which the object enters into the light curtain and at that side toward which the object moves.

In a highly advantageous case of use, one detector strip and one or more light sources are arranged in each case at two opposite edges of an area to be monitored for passage. From the detection result of the two detector strips, the height of the object moved through the area can be determined by mathematical methods. For the cases in which light curtains and/or detector areas are not oriented vertically, instead of "height of the object" it is better to say in a generalizing manner "the object dimension perpendicular to the plane of the detector areas and to the area to be monitored".

In one advantageous case of use, double light curtains of this type are arranged on a plurality of walls of a room horizontally, typically in proximity to the floor. It is thus possible to monitor the movement of objects on the floor in the entire room. With skillful application of evaluation logic and if the objects which can be situated in the room can be conscribed to a certain extent from the outset, a class to which a moving object belongs can thus be automatically detected as well. Such classes might be, for example: humans, furniture, transport devices, items of luggage, various species of pets and/or working animals.

Since, with the design according to the invention, a detector can be readily realized not only as a long strip but also as a relatively large area, in one advantageous case of use the floor area of a room, of an aisle or a storage area in a warehouse overall can be embodied as a detector area and be illuminated from further above. Thus, of course, the movement of an object on an area can be readily detected, but the occupancy of warehouse areas can also be readily detected and the knowledge about occupied area regions can readily be used to control automatic transport systems such that the latter do not collide with objects but can, as necessary, rapidly find objects and e.g. take hold of them in a targeted manner.

The invention is illustrated with reference to exemplary, stylized drawings that are not to scale:

FIG. 1: shows an exemplary detector according to the invention, embodied as a strip, with the viewing direction toward the plane of the electrical connection lines.

Figure 2:
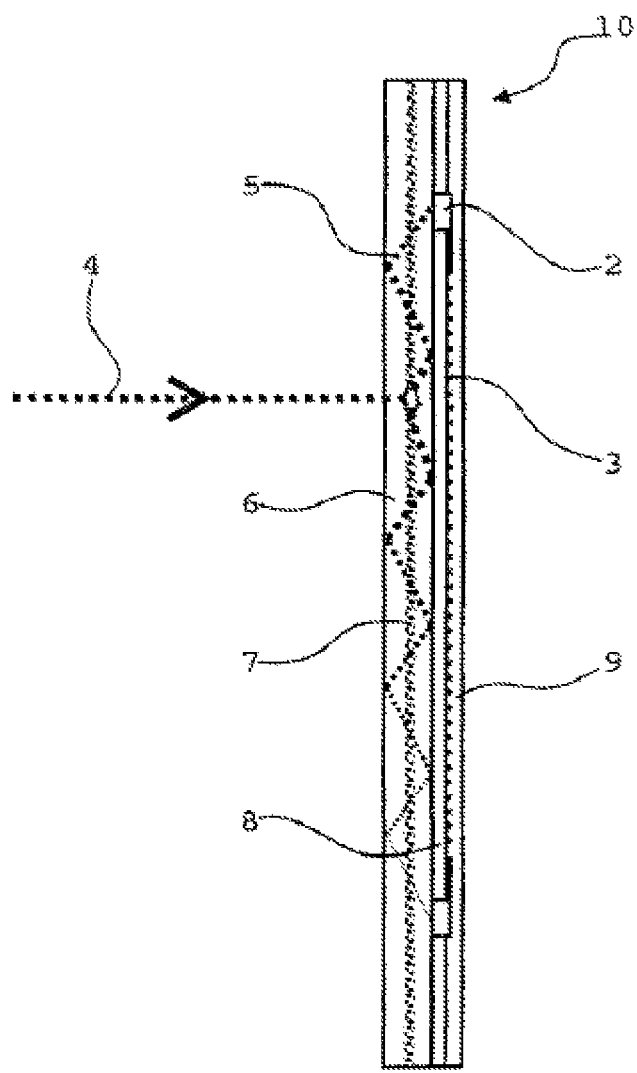

FIG. 2: shows one possible embodiment of the strip shown in FIG. 1, in cross-sectional view. (For reasons of visibility, here and also in FIG. 3 the layer thicknesses are illustrated in a manner enlarged more than proportionally and sectional areas are illustrated in a hatched manner, unlike the normal convention.)

Figure 3:
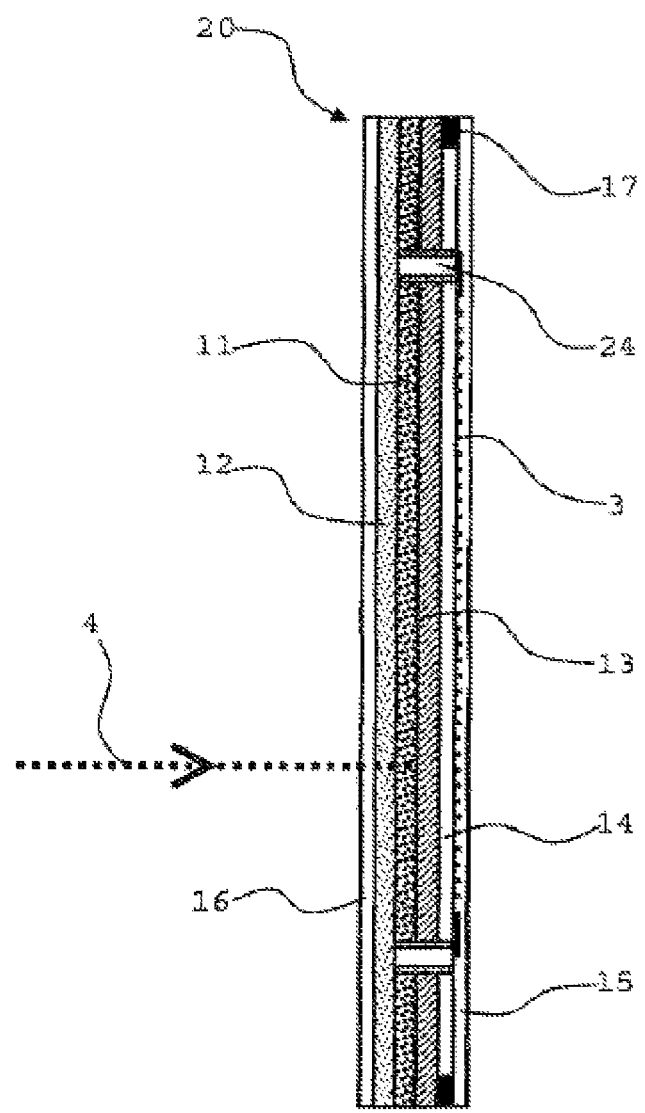

FIG. 3: shows a further possible embodiment of the strip shown in FIG. 1, in cross-sectional view.

Figure 4:
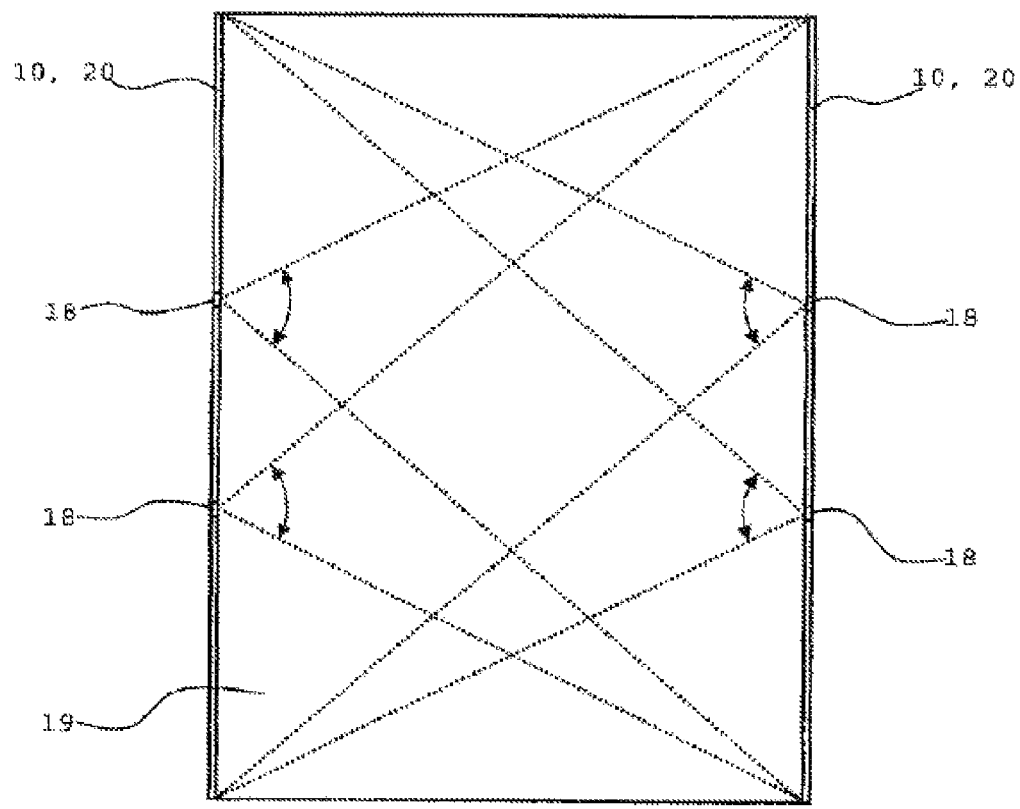

FIG. 4: shows an application situation of detectors according to the invention embodied as strips in a light curtain. The viewing direction is perpendicular to the plane monitored by the light curtain.

Figure 5:
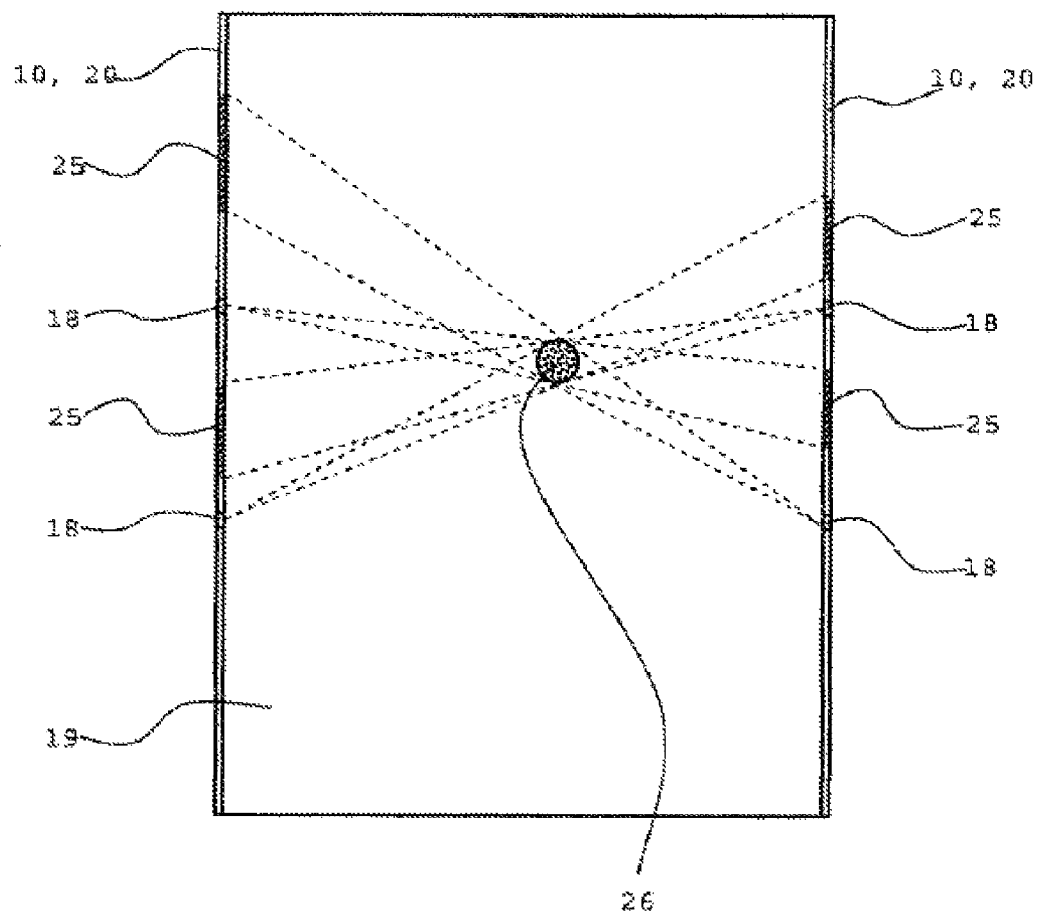

FIG. 5: shows the conditions from FIG. 4 when an object that casts a shadow is present.

Figure 6:
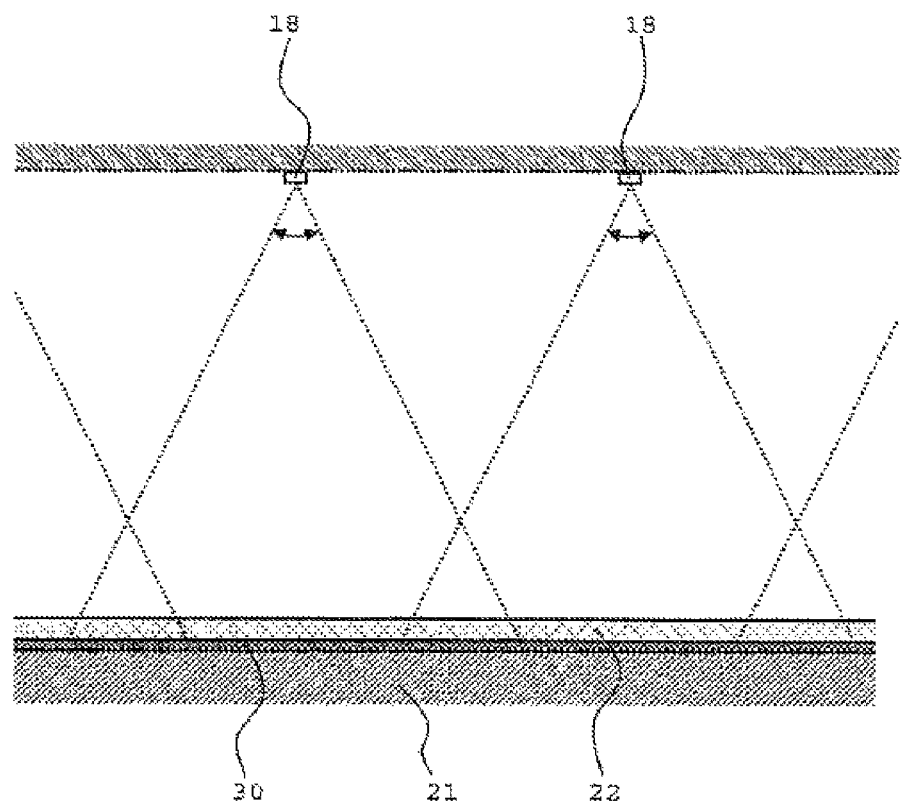

FIG. 6: shows, from a horizontal viewing direction, an application situation for a detector according to the invention for monitoring the state of occupancy of a floor area.

Two rows of tapping points 2, 24 are arranged on the strip-type detector 10, 20 in accordance with FIGS. 1 to 3, electrical signals whose magnitudes is determined by light incidence on the detector area being present at said tapping points.

A respective connection line 3 is connected to a tapping point 2, 24 and runs from the latter in the longitudinal direction of the detector as far as connecting locations 23 with lines that lead away from the detector. With the aid of printing and connecting techniques known from printed circuit board manufacture, the circuit structure shown in FIG. 1 can readily be produced. Ultimately, a manageable strip that is convenient to mount is formed, from which wires or cables lead away only at one end region. The rear side of the strip can be provided with an adhesive layer, which, until the time of mounting, can be covered with a protective film that can be stripped away.

The line structure shown in FIG. 1 is inherently free of crossings. As known from printed circuit board manufacture, crossings of lines can also be formed, of course, using interlayers and local feedthroughs. Then, for the same number of tapping points, the width of the strip can be reduced to a greater extent and a connection line 3 can be led from each tapping point 2, 24 toward both ends of the strip-type detector and can be ended at a connecting location 23. The detector strip thus formed can be divided in a simple manner by being cut apart to form two shorter, but otherwise fully equivalent detector strips.

FIG. 2 shows, in cross-sectional view, an exemplary layered structure of a detector strip 10, using luminescent wave guiding. Between two layers 6 composed of PET there is laminated a thinner layer 7 composed of a homogeneous mixture of the plastic polyvinyl alcohol and the dye rhodamine 6G. The PET layers 6 together with the intervening layer 7 form an optical waveguide. The layer 7 is photoluminescent. "Conventional", small-area silicon photodiodes 2 are arranged at a pitch distance with respect to one another. They have a cross-sectional area of $2 \times 2$ mm$^2$, for example. They form the actual photoelectric sensors. The photodiodes 2 are fitted, at that side of the PET layers 6 which faces away from the direction of incidence, to the PET layer there such that they couple out light from the PET layer and couple it in at their pn junction. The signals of the photodiodes 2 are conducted via the connection lines 3 to the connecting locations 23 (FIG. 1) with the further lines leading to a controller.

If a light beam 4 with an appropriate spectrum impinges on the layer 7, then it triggers luminescence in the integrated particles. The longer-wave light 5 that arises in this case is largely coupled into the waveguide formed by the layers 6 and 7. The light 5 in the waveguide mode is attenuated by the distribution and damping in the waveguide. Consequently, a different intensity of the light in the waveguide mode is measured at the photoelectric sensors 2, depending on the distance between the impingement point of the luminesence-generating light 4 and the photoelectric sensor. The position of the impingement point can be calculated from the magnitude ratios of the signals at the different tapping points. The absolute magnitude of the individual signals is unimportant in this case; all that is important is their magnitude ratio with respect to one another. The individual layers 6, 7, 8 and 9 of the detector strip extend without interruption to a multiplicity of photoelectric sensors. It is therefore not necessary to divide these layers into individual partial areas which are assigned only to one photoelectric sensor 2 in each case.

By using two rows of photoelectric sensors 2 instead of only one row, it becomes possible to identify the direction in which an object traverses a light curtain operating with the use of the detector 10.

The layer 8 is an intermediate layer between the connecting lines 3 and the waveguide 6. It is intended to have a significantly lower refractive index than the layer 6 in order that it does not couple out any light of the wave guiding.

The layer 9 is an outer protective layer over the connecting lines 3 and the photoelectric sensors 2. It may perfectly well be expedient also to fit on the opposite side of the layered structure a protective layer transparent to the relevant spectral range over the waveguide 6.

FIG. 3 shows a further exemplary layered structure of a detector strip 20 in cross-sectional view. On an electrically insulating, light-transmissive protective layer 16, which is typically a plastic film, there is arranged as a transparent or semitransparent planar electrode 12, which "is poorly conducting", that is to say, although it consists of an electrically conductive material, it represents an appreciable non-reactive resistance within the system. This "poorly conductive electrode" can be a very thin metal layer, a transparent conductive oxide (TCO), a conductive polymer, or it can be a carbon nanotube network. The layer thickness of said electrode is dimensioned such that its sheet resistance in the event of current flow causes a significant voltage drop in the respective electric circuit. At a pitch distance with respect to one another, some tapping points 24, that is to say local connection electrodes, form the connections of said poorly conductive electrode 12 to an external electric circuit.

The layer which is adjacent to the "poorly conductive electrode" 12 and is conductively connected thereto is a photoactive organic semiconductor layer 11. This layer can be a photoconductor or a photovoltaically active element. That is to say, upon absorption of light, its electrical resistance can collapse, or an electrical voltage can be generated between two interfaces of the layer. In the first case, a current can flow when an external voltage is present; in the second case, a current can flow by the electric circuit being closed by means of an external loop.

The second side of the photoactive organic semiconductor layer 11 is followed by a planar electrode 13 conductively connected thereto, which electrode ideally has a very low non-reactive resistance in comparison with the other components of the electric circuit. It can be formed by a metal layer, a conductive polymer, a conductive oxide or else by a carbon nanotube network. If the electrode 13 consists of the same material as the electrode 12, then it should have substantially greater thickness than electrode 12. The conductivity of the electrode 13 can be supported by wires or films composed of a highly electrically conductive metal which are adjacent thereto and are conductively connected thereto. In the example illustrated, the electrode 13 can be connected to an external electric circuit via two lines 17, which extend over the length of the detector 20 and bear by their lateral surface against the electrode 13.

If a light beam 4 with an appropriate wave spectrum impinges on a point of the photoactive organic semiconductor layer 11, then a current flows through the poorly conductive electrode 12 to the tapping points 24. On account of the non-reactive resistance of the electrode 12, the magnitude of the current at the individual tapping points 24 is greatly dependent on their proximity thereof to the impingement point of the light beam 4. As a result, by measuring the individual currents, the impingement point of the light beam 4 can be calculated back from their magnitude ratio with respect to one another. In the case of this structure, too, the absolute magnitude of the individual signals is unimportant in this case; all that is important is their magnitude ratio with respect to one another.

The individual layers 11, 12, 13, 14, 15, 16 of the detector strip extend without interruption to a multiplicity of tapping points 24. Therefore, here, too, it is not necessary to divide these layers into individual partial areas which are assigned only to one tapping point 24 in each case.

As in the previous example, here too, by using two rows of tapping points 24 instead of only one row, it becomes possible to identify the direction in which an object traverses a light curtain operating with the use of the detector 20.

The layer 24 is an electrically insulating intermediate layer between the connecting lines 3 and the electrode 13.

The layer 15 is an outer protective layer over the connecting lines 3 and the tapping points 24.

FIG. 4 illustrates one advantageous case of application of detectors according to the invention. A strip-type detector 10, 20 is in each case fitted at opposite, mutually parallel edges of an area 19 to be monitored for passage. A plurality of light sources 18 are in each case fitted to said edges which light sources emit a light beam having a line-shaped cross-sectional area from an exit gap, wherein the line lies in the area 19 to be monitored and is lengthened with distance from the light source 18. FIG. 4 illustrates the limits of the illumination region of the individual light sources 18 by means of dotted lines. If a non-transparent object is situated in the area 19, then it shades light sources 18 from the detector respectively arranged at the opposite edge of the area. From the magnitude ratios and positions of the shadings at the individual detectors, it is then readily possible to automatically calculate back to the position of the object in the area 19 and to its dimensions if the radiations emitted by the individual light sources can be distinguished from one another. That can be achieved in a simple manner for example by virtue of the intensity of the radiation of the individual light sources fluctuating with a frequency characteristic of the individual light sources. Therefore, the electrical signal arriving at a tapping point with the frequency as selection criterion can be split into individual partial signals and the individual partial signals can be assigned uniquely to individual light sources 18. It would likewise be possible to use different spectral ranges for different light sources. One simple possibility also consists in assigning, within a common temporal clock interval of all the light sources, to the individual light sources different partial intervals in which they exclusively are permitted to emit radiation.

FIG. 4 is applicable to areas 19 to be monitored that have any desired spatial position. These areas are typically oriented vertically, e.g. they are gate passages. However, it is also possible for the area 19 to be assumed to be a horizontal area, for example an area just above the floor area of a room. The position or movement of objects in a room can then be detected by means of this arrangement.

FIG. 5 serves to illustrate the principles of an algorithm that leads to the determination of size, shape and location of a shading object. For this purpose, FIG. 5 shows the arrangement from FIG. 4 supplemented by a shading object 26 lying in the area 19. The longitudinal regions 25 highlighted by hatching on the detectors 10, 20 are those at which in each case at least one light source 18 is shaded by the object 26. Between the shaded longitudinal regions 25 and the associated light sources 18, a respective triangular area is circumscribed which encompasses the shading object 26. From the knowledge of the location of a light source and of an associated region 25 alone, it can only be stated that the shading object in its entirety must lie within the relevant triangular area and must touch the two sides of the triangle that proceed from the light source. If a plurality of light sources 18 are present, a plurality of such triangles are formed. The shading object 26 must then lie within the common intersection area of all the triangular areas proceeding from the individual light sources 18. If a plurality of shading objects are present, generally the number of shaded regions 25 produced is greater than the number of light sources 18 present. The shaded longitudinal regions are detected by ascertaining that, at these longitudinal regions, an otherwise distinctly present signal is absent or is present only very weakly.

An interesting and valuable case of application for the detectors according to the invention consists in thereby arranging a light curtain substantially parallel to a display area on that side in front of a display area from which the display area is looked at. By using, in the manner already explained, a plurality of light sources which are arranged at a distance from one another and can be distinguished from one another in terms of the detection result, it is thus possible to identify at which area part of the display area an object is brought up to the display area. If that is applied to a computer screen, and the detected location at which an object is moved up to the screen is assigned a significance in the data processing system, a touch screen has been realized. On account of the simple, cost-effective and robust realizability of a light curtain of this type, it is appropriate to fit it not only to screens but also to other (passive) display areas such as display window panes, hoardings, billboards, etc. It is thus possible to detect, for example, which objects are pointed at particularly often, which can be valuable information for marketing purposes, for example. By arranging two light curtains of this type closely alongside one another and parallel to one another, it is also possible to identify the location being pointed at by means of an elongate object extending through both light curtains (such as e.g. a pointer, an arm or a finger).

FIG. 6 shows a case of application wherein the detector 30 according to the invention is not embodied as a strip, but rather as a relatively large area in two dimensions. It is spread on the floor 21 of a room, aisle or a storage area in a warehouse and protected against mechanical damage by a covering layer 22, which can be formed by a ceramic, glass, a transparent plastic or else only by a grille. Light sources 18 are arranged at a distance above the covering layer 22. Objects which move on the covering layer 22 or are placed on it are thus readily detectable automatically. The detection results can be utilized not only for purposes of safeguarding areas or for detecting warehouse stocks, but also for controlling automatic transport systems in order that the latter firstly do not collide with objects in an undesired manner, but secondly can rapidly find required objects and take hold of them in a targeted manner.

As in the case of known light curtains as well, upon application of the detectors according to the invention, too, there is the possibility of fitting the light sources and the detector to the same edge region of an area to be monitored or to the same edge area of a room to be monitored and of fitting at the opposite edge region of the area to be monitored, or at the opposite area of the room region to be monitored, only reflectors for the light that is significant for the measurement. Thus, mounting can be simplified and the robustness can often also be improved. However, the identifiability of the size of objects causing shadings can thereby be made more difficult. In the case of monitoring an area on the basis of light sources arranged in a line and on the basis of a detector extending along the same line, in this case the reflectors opposite the light sources and the detector should be embodied, with regard to that direction component which is perpendicular to the area to be monitored, as retroreflectors, that is to say as reflectors which predominantly reflect light back in approximately precisely that direction from which it arrived.

As in the case of known light barriers and light curtains as well, the problem that ambient light must not corrupt the result is taken into account by either
  the spectral range of light which the detectors 10, 20, 30 perceive and in which the light sources 18 operate being different than that of the light arriving from the surroundings, or
  the radiation intensity of the light sources 18 being frequency-coded and this frequency being filtered out by means appertaining to telecommunications technology from the signals supplied by the tapping points 2, 24, or
  the light from the light sources 18 having, in a very narrow spectral range, a significantly higher spectral power density than otherwise occurs, and the detectors 10, 20, 30 firstly selecting as far as possible exactly this spectral range and, in the context of the signals detected in this case, only those whose intensity lies above a certain limit level permitted as characteristic of the light sources.

The invention claimed is:

1. A planar detector intended for use in light curtains, comprising:
  a flexible layered structure that includes a multi-layer planar optical waveguide, wherein at least one layer of the planar optical waveguide has photoluminescent properties;
  a plurality of photoelectric sensors that form tapping points in the layered structure that are arranged at a distance from edges of the layered structure; and
  electrical connection lines connected to the photoelectric sensors and connected over their longitudinal course to the layered structure of the detector;
  wherein an external light impinging on the layered structure causes luminescence in the waveguide from an area of impingement outward toward the tapping points, wherein electrical signals are generated at the tapping points in a manner dependent on absorbed light, wherein a magnitude of the signals at the individual tapping points is dependent on their distance from the area of impingement, and wherein magnitude ratios between the signals at a plurality of the tapping points enables a calculation of distance ratios of the respective tapping points in relation to those points or areas at which light is impinging on the detector.

2. The detector as claimed in claim 1, wherein the connection lines are printed onto a layer of the layered structure.

3. The detector as claimed in claim 1, wherein the connection lines are adhesively bonded onto a layer of the layered structure.

4. The detector as claimed in claim 1, wherein the connection lines are arranged on the side facing away from the light incidence of that layer in which the light to be detected is absorbed.

5. The detector as claimed in claim 1, wherein it has the form of an elongated strip with two rows of tapping points that extend along the longitudinal direction of this strip, said rows being situated at a distance from one another.

6. The detector as claimed in claim 1, wherein it is used in an arrangement for forming a light curtain, which arrangement consists of at least two detectors arranged at different edge regions of an area to be monitored and a plurality of light sources, wherein the light sources emit the light relevant to the measurement, wherein more than only one light source emits light onto at least one detector, and wherein the radiations arriving at a detector from the different light sources are set such that they are distinguishable to the effect that, from the detection result with regard to a radiation, it is possible to identify from which light source this radiation originates.

7. The detector as claimed in claim 6, wherein it is arranged on the wall of a room, and in that the area to be monitored is oriented horizontally.

8. The detector as claimed in claim 6, wherein it is arranged in front of a display area and serves to identify which area region in or behind the display area is pointed at or an object is moved toward.

9. The detector as claimed in claim 8, wherein the sensor based functional part of a touchscreen is realized therewith.

10. The detector as claimed in claim 8, wherein it is arranged in front of a display window area, a billboard or a hoarding.

11. The detector as claimed in claim 1, wherein it extends on a floor area and is irradiated from above with the light relevant to the detection.

12. The detector as claimed in claim 1, wherein the layered structure comprises an organic light emitting display.

* * * * *